United States Patent [19]

Tatematsu

[11] Patent Number: 4,982,369

[45] Date of Patent: Jan. 1, 1991

[54] SELF-REFRESH SEMICONDUCTOR MEMORY DEVICE RESPONSIVE TO A REFRESH REQUEST SIGNAL

[75] Inventor: Takeo Tatematsu, Yokohama, Japan

[73] Assignee: Fujitsu Limited, Kawasaki, Japan

[21] Appl. No.: 442,385

[22] Filed: Nov. 27, 1989

Related U.S. Application Data

[63] Continuation of Ser. No. 117,589, Nov. 6, 1987, abandoned.

[30] Foreign Application Priority Data

Nov. 7, 1986 [JP] Japan .................. 61-265372

[51] Int. Cl.$^5$ .................................. G11C 7/00
[52] U.S. Cl. .......................... 365/222; 365/210; 365/149; 365/194
[58] Field of Search ............... 365/222, 149, 194, 233, 365/203, 200, 210

[56] References Cited

U.S. PATENT DOCUMENTS

| | | | |
|---|---|---|---|
| 4,360,903 | 11/1982 | Plachno et al. | 365/222 |
| 4,677,590 | 6/1987 | Arayawa | 365/210 |
| 4,682,306 | 7/1987 | Sakurai et al. | 365/222 X |
| 4,734,890 | 3/1988 | Miyatake et al. | 365/210 X |
| 4,794,571 | 12/1988 | Uchida | 365/210 |
| 4,809,233 | 2/1989 | Takemae | 365/222 X |

FOREIGN PATENT DOCUMENTS 55-125662  9/1980  Japan .
55-150191  11/1980  Japan .

OTHER PUBLICATIONS

System Design/Integrated Circuits, Computer Design, vol. 22, Mar. 1983, No. 3, "The Chip That Refreshes Itself", by J. J. Fallin et al.
Sawada et al., VLSI Symposium 1986, p. 85, Semiconductor Device Engineering Laboratory, "Self-Aligned Refresh Scheme".

Primary Examiner—Stuart N. Hecker
Assistant Examiner—Alfonso Garcia
Attorney, Agent, or Firm—Armstrong, Nikaido, Marmelstein, Kubovcik & Murray

[57] ABSTRACT

A semiconductor memory device carrying out a self-refresh operation in response to a refresh request signal. The device includes a memory cell array formed on a chip; a plurality of pseudo memory cells distributed and arranged on the chip, each having the same constitution as the memory cells in the memory cell array; a first circuit for monitoring the capacitor voltage in the pseudo memory cells; and a second circuit for generating the refresh request signal and charging each capacitor in the pseudo memory cells. When the potential of at least one of the capacitors in the pseudo cells falls below a predetermined level, the refresh request signal is generated, thereby enabling the device to lengthen a refresh interval as desired and to decrease power dissipation, while facilitating work requiring any adjustment.

9 Claims, 5 Drawing Sheets

Fig. 2
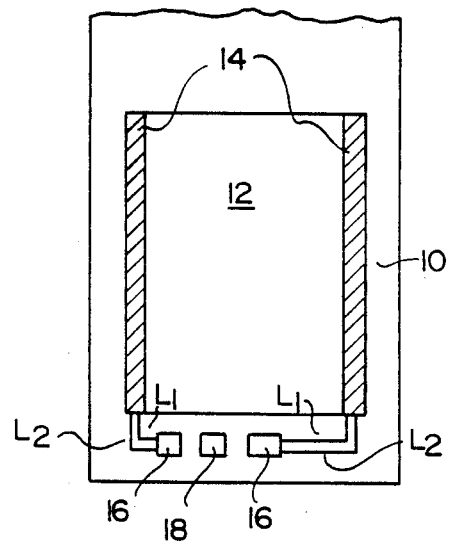
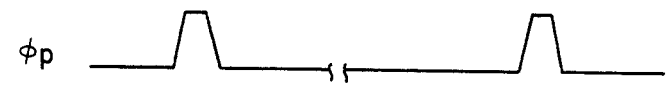
Fig. 4a  $\phi_p$
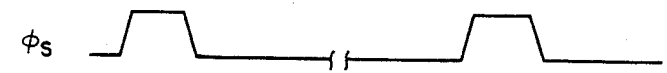
Fig. 4b  $\phi_s$
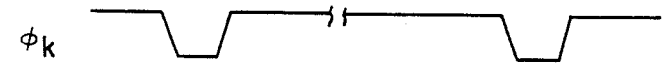
Fig. 4c  $\phi_k$
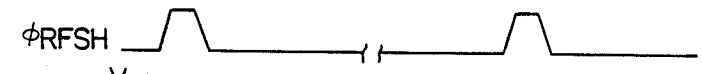
Fig. 4d  $\phi_{RFSH}$
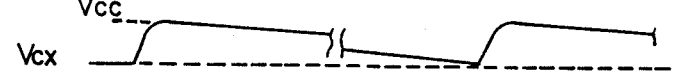
Fig. 4e  $V_{cx}$

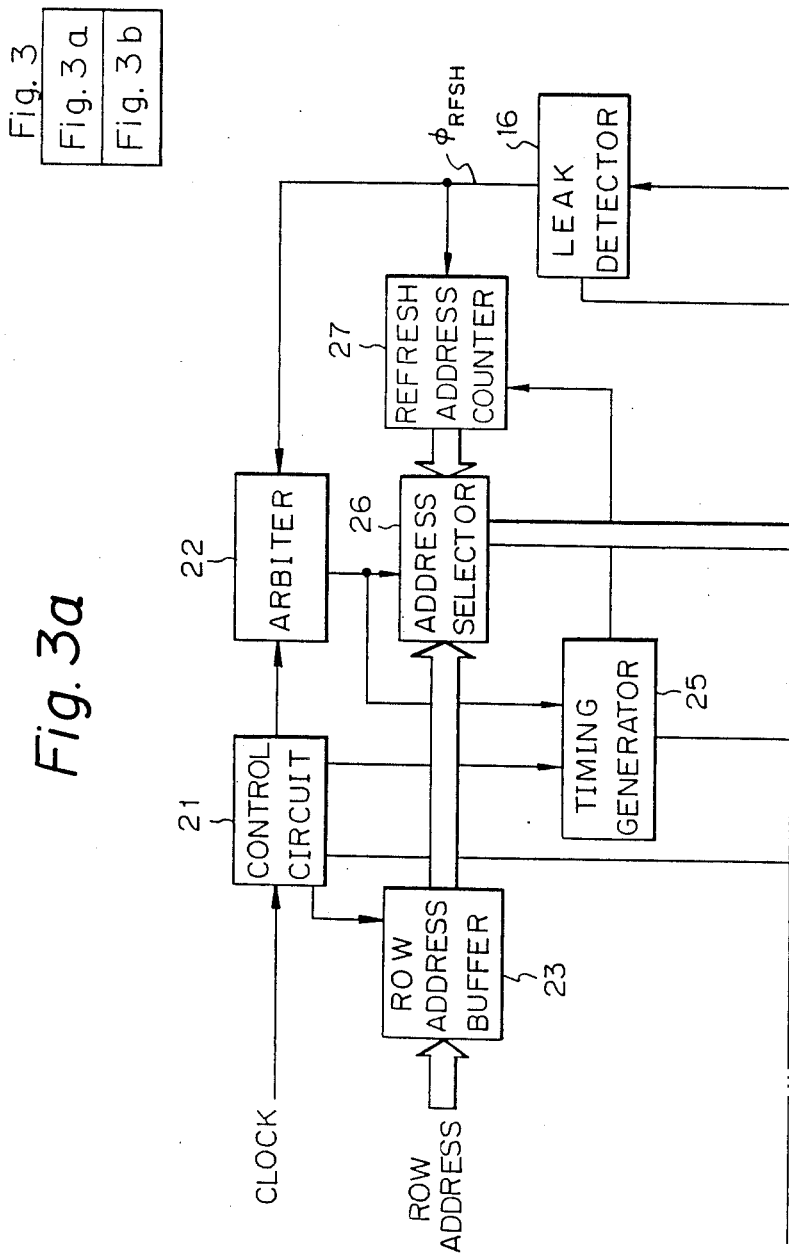

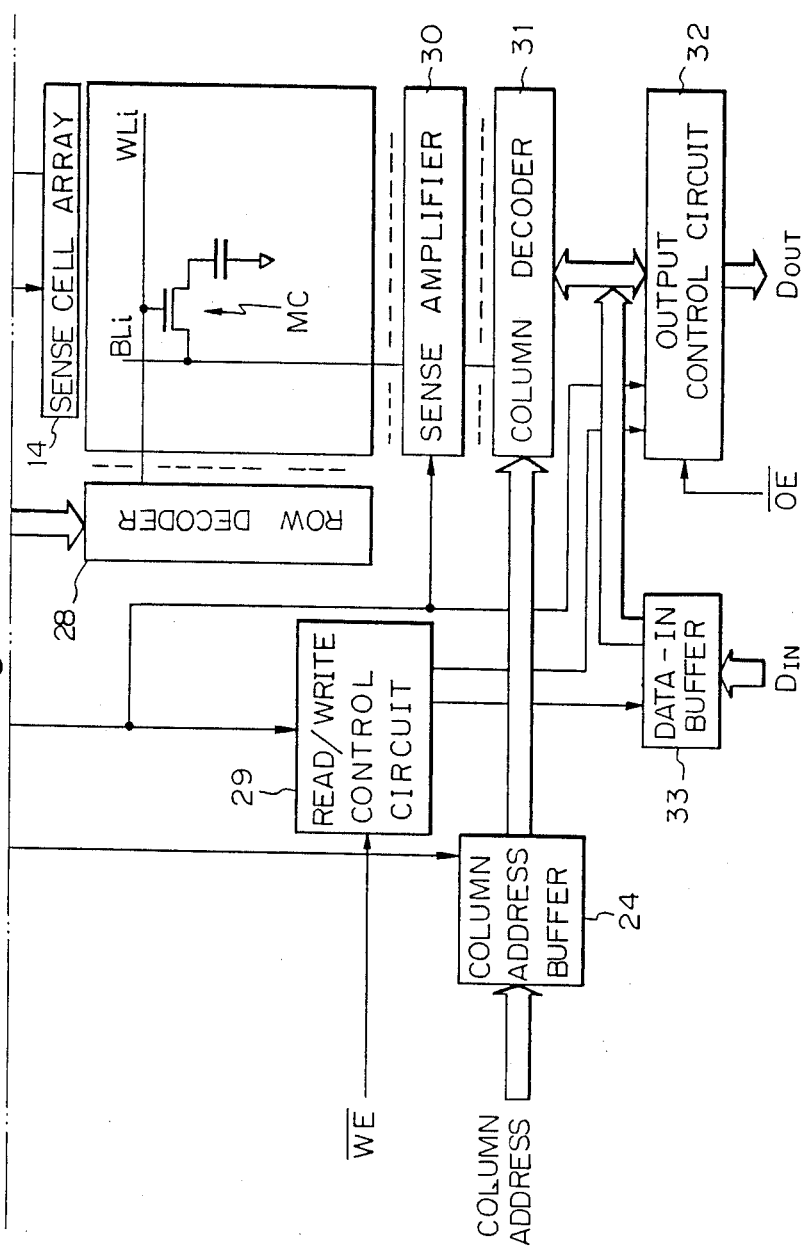

SELF-REFRESH SEMICONDUCTOR MEMORY DEVICE RESPONSIVE TO A REFRESH REQUEST SIGNAL

This application is a continuation of application Ser. No. 117,589 filed Nov. 6, 1987 now abandoned.

BACKGROUND OF THE INVENTION

1. Field of the Invention

The present invention relates to a semiconductor memory device and, more particularly, to a semiconductor memory device which generates a refresh request signal to carry out a self-refresh when a refresh is needed.

2. Description of the Related Art

In a dynamic random access memory (DRAM) including a memory cell having a capacitor for retaining information, the information gradually fades away and vanishes due to a leakage of the charges in the capacitor as the time elapses. Accordingly, before the information vanishes, an operation by which the information is refreshed i.e., a refresh operation, must be carried out.

The refresh operation is based on a refresh request signal, which is usually generated by a central processing unit (CPU) provided outside the DRAM chip, or by a timer or a ring oscillator provided inside the chip. In either case, the refresh is carried out intermittently. In practice, a DRAM which can detect whether or not a refresh is needed and can carry out the refresh when the potential of the capacitor of the memory cell is changed to an extent such that a refresh is needed, has been proposed.

Where the DRAM carries out a self-refresh operation, the function thereof is equivalent to that of a static RAM (SRAM), from the aspect of a CPU outside the chip, although a problem of a conflict in the priority between a memory access and the refresh exists inside the chip. Accordingly, such a DRAM is referred to as a pseudo SRAM (PSRAM).

On the other hand, fluctuations in the time interval at which the refresh is needed are caused by the voltage, temperature, manufacturing process, e.g., amount of leakage in the capacitor, and the like. In the method where the refresh is periodically carried out, e.g., using a clock signal output by a timer, the refresh interval must be shortened (usually about 4 msec) to ensure that a destruction of the content of memory is prevented at all costs. Accordingly, the number of times a refresh operation is carried out is increased, resulting in an increase in the power dissipated and an increase in the number of times a conflict occurs between the refresh and the memory access. That is, the method where the refresh is periodically carried out irrespective of the timing at which a refresh is actually needed is not preferable.

Conversely, a method is known wherein the refresh is carried out at the timing at which a refresh is actually needed, based on a detection of the potential of the capacitor. In this method, the refresh interval can be lengthened as required, resulting in a decrease in the power dissipated and a decrease in the number of times a conflict occurs between the refresh and the memory access. In particular, the advantage of the former method is that it contributes to a battery back-up operation. The method of detecting the timing at which the refresh is needed is realized by an arrangement wherein a detecting capacitor having the same constitution as a capacitor of a memory cell is formed on a substrate, so that the voltage thereof can be detected, and the detecting capacitor is charged during the refresh operation, and when the voltage thereof falls below a predetermined value, the refresh request signal is generated.

In this case, the timing of the generation of the refresh request signal must be selected so that the correct read operation can be carried out even for a memory cell at which a leak first occurs among all of the memory cells. However, this can be changed depending on the characteristics of the substrate, i.e., the chip. Also, a problem arises in the selection of the location of the detecting capacitor on the substrate. Accordingly, conventional measurements have been taken whereby a plurality of detecting capacitors are connected via fuses and a desired capacitance is obtained by cutting the fuses by a laser beam so that a desired refresh timing is obtained in each chip.

However, obtaining the desired capacitance by cutting the fuses by a laser beam is difficult and cumbersome. Determining the desired value of the capacitance is also cumbersome, and further, if the same capacitance is selected for each chip, a sufficient margin must be assured. In this case, the refresh interval is shortened, and thus there is little difference between the method utilizing the detection of the potential of the capacitor and the method wherein the refresh is periodically carried out using an external clock.

SUMMARY OF THE INVENTION

A principal object of the present invention is to provide a semiconductor memory device capable of lengthening a refresh interval to the greatest extent possible, while facilitating adjustment work.

Another object of the present invention is to provide a semiconductor memory device capable of decreasing power dissipation.

The above objects are attained by providing a semiconductor memory device carrying out a self-refresh in response to a refresh request signal, the device including: a memory cell array formed on a chip and including a plurality of memory cells, each being provided at each of the intersections between a plurality of word lines and a plurality of bit lines and having a capacitor for retaining information to be refreshed by the refresh; a plurality of pseudo memory cells distributed and arranged on the chip, each having the same constitution as the memory cell in the memory cell array; a first circuit operatively connected to the plurality of pseudo memory cells for monitoring the potential of each capacitor in the pseudo memory cells and generating a detection signal when the potential of at least one of the capacitors falls below a predetermined level; and a second circuit operatively connected to the first circuit for generating the refresh request signal in response to the detection signal and temporarily charging each capacitor in the pseudo memory cells.

BRIEF DESCRIPTION OF THE DRAWINGS

Other objects and features of the present invention will be described hereinafter in detail by way of a preferred embodiment with reference to the accompanying drawings, in which:

FIG. 2 is a plan view schematically illustrating an example of the arrangement of the sense cell array shown in FIG. 1;

FIGS. 3 and 3a-b are a block diagram illustrating the whole constitution of the device shown in FIG. 1;

FIGS. 4a to 4e are waveform diagrams for explaining the operation of the device shown in FIG. 1;

DESCRIPTION OF THE PREFERRED EMBODIMENTS

Figure 1:
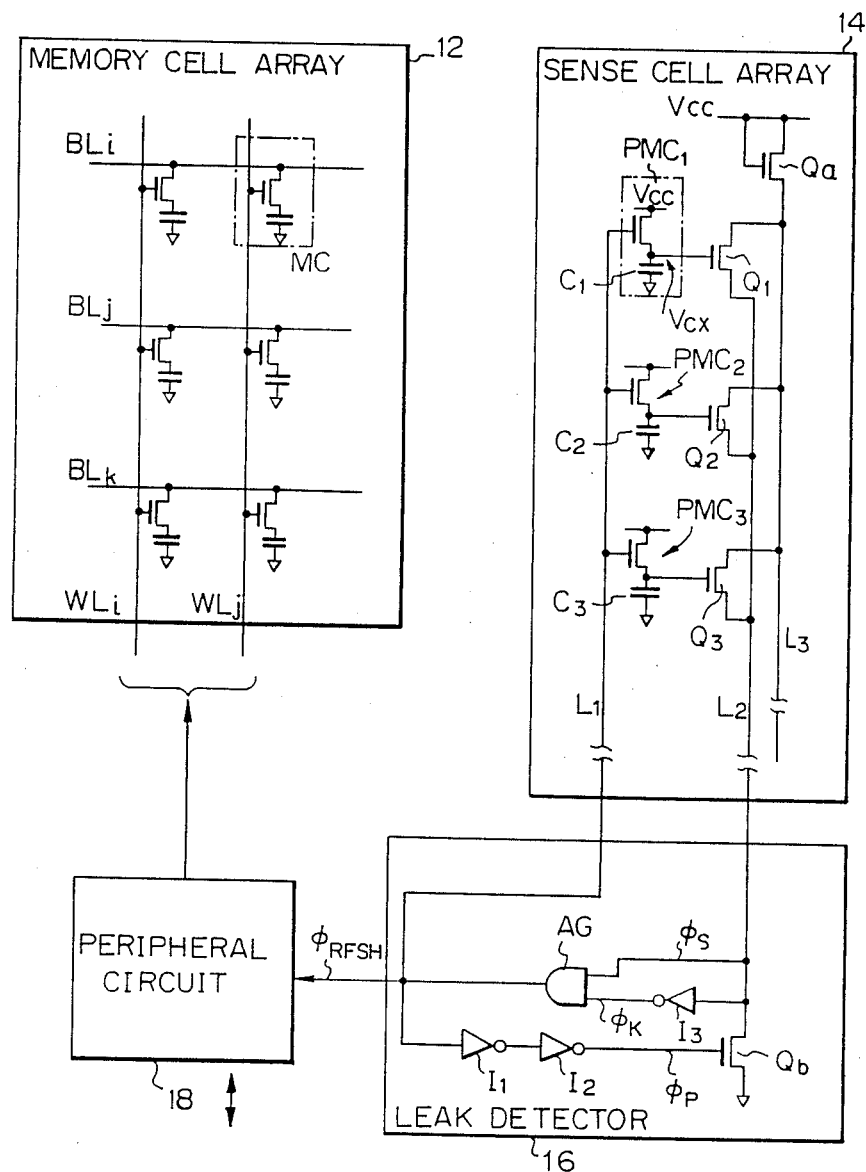
FIG. 1 is a circuit diagram illustrating main parts of a semiconductor memory device as an embodiment of the present invention.

A preferred embodiment of the present invention will be described hereinafter in detail with reference to FIG. 1.

Reference 12 denotes a memory cell array formed on a chip (not shown in FIG. 1) and including a plurality of memory cells MC. Each of the memory cells is provided at each of the intersections of a plurality of word lines $WL_i$, $WL_j$, ---, and a plurality of bit lines $BL_i$, $BL_j$, $BL_k$, ---, and is constituted by a combination of a transistor and a capacitor. Each memory cell MC in the memory cell array 12 is referred to as a real cell, in that it is actually employed for retaining information.

Reference 14 denotes a sense cell array including a plurality of pseudo memory cells $PMC_1$, $PMC_2$, $PMC_3$, ---, each having the same constitution as the memory cell MC, a plurality of p-channel MOS transistors $Q_1$, $Q_2$, $Q_3$, ---, provided for each of the pseudo memory cells, an n-channel MOS transistor Qa for the load, a power supply line $V_{CC}$ having a higher voltage of 5 V, and signal lines $L_1$, $L_2$ and $L_3$. In the sense cell array 14, the gate of a transistor in each of the pseudo memory cells is connected to the gate controlling line $L_1$ and the connection point of the transistor, and a capacitor $C_1$, $C_2$, $C_3$, ---, corresponding thereto is connected to the gate of the corresponding p-channel MOS transistor. The transistors $Q_1$, $Q_2$, $Q_3$, ---, are connected in parallel between the lines $L_2$ and $L_3$. The line $L_3$ is connected via a depletion type n-channel MOS transistor Qa to the power supply line $V_{CC}$.

In the sense cell array 14, when the potential $V_{CX}$ of at least one of the capacitors $C_1$, $C_2$, $C_3$, ---, falls below a predetermined level, the corresponding p-channel MOS transistor $Q_1$, $Q_2$, $Q_3$, ---, is turned ON, and thus the potential level on the line $L_2$ is raised to about the potential level on the line $L_3$. Note, the potential level on the line $L_3$ is indicated by $V_{CC}-V_{THN}$, where $V_{THN}$ is a threshold voltage of the transistor Qa, and accordingly, the potential level on the line $L_2$ is indicated by $V_{CC}-V_{THN}-V_{THP}$, where $V_{THP}$ is a threshold voltage of each of the transistors $Q_1$, $Q_2$, $Q_3$, ---.

Reference 16 denotes a leak detector including an AND gate AG, three inverters $I_1$, $I_2$, $I_3$, and an n-channel MOS transistor Qb. In the detector 16, the line $L_2$ is directly connected to one input end of the gate AG, is connected to another input end thereof via the inverter $I_3$, and is grounded via the MOS transistor Qb. The output end of the AND gate AG is connected to the line $L_1$, the inverter $I_1$, and a peripheral circuit 18. The output end of the inverter $I_1$ is connected via the inverter $I_2$ to the gate of the transistor Qb. Each inverter $I_1 \sim I_3$ functions to delay the propagation of a signal.

Therefore, in the detector 16, when the signal $\phi_s$ changes from low level to high level, the output signal $\phi_k$ of the inverter $I_3$ remains at a high level, and thus the output signal of the AND gate AG, hereinafter referred to as a refresh request signal $\phi_{RFSH}$, becomes high level. The change of this signal $\phi_{RFSH}$ is transmitted to the gate of the transistor Qb with a predetermined delay as a signal $\phi_p$, and the transistor Qb is turned ON and OFF in accordance with the level of the signal $\phi_p$.

The peripheral circuit 18 selects the word lines $WL_i$, $WL_j$, ---, in sequence in the memory cell array 12 in response to the refresh request signal $\phi_{RFSH}$, as later discussed.

The aforementioned pseudo memory cells $PMC_1$, $PMC_2$, $PMC_3$, ---, are employed in order to determine the refresh time interval of the real cells in the memory cell array 12 and, accordingly, should be selected so as to represent each real cell. In the present example, the sense cell array 14 including the pseudo memory cells is provided next to the left or right end of the memory cell array 12 formed on the chip 10, as shown in FIG. 2. The pseudo memory cells are constituted by memory cells corresponding to one word line. Note, since the pseudo memory cells are not employed for retaining an information, they are not controlled by a word decoder or a column decoder and are excluded from an address space. The pseudo memory cells may be constituted by memory cells corresponding to one word line provided in the center of the memory cell array 12. The pseudo memory cells also may be constituted by memory cells corresponding to every other column in one word line, resulting in a decrease in the number of cells.

Next, the whole constitution of the device shown in FIG. 1 and the operation thereof will be explained with reference to FIG. 3. Note, since the memory cell array 12, sense cell array 14 and leak detector 16 have been explained with reference to FIGS. 1 and 2, a description thereof is omitted.

Reference 21 denotes a control circuit, which generates four control signals in response to an external clock signal. Reference 22 denotes an arbiter, which, in response to a first control signal from the control circuit 21 and the refresh request signal $\phi_{RFSH}$ from the leak detector 16, outputs one of those two signals. Reference 23 denotes a row address buffer, which effects buffering of an external row address signal for selection of the word line and transmits the signal to an address selector 26 in response to a second control signal from the control circuit 21. Similarly, reference 24 denotes a column address buffer, which effects buffering of an external column address signal for selection of the bit line and transmits the signal to a column decoder 31 in response to a third control signal from the control circuit 21. Reference 25 denotes a timing generator, which generates two timing signals in response to a fourth control signal from the control circuit 21 and the output from the arbiter 22.

Reference 26 denotes an address selector which, in response to the output from the arbiter 22, selects one of the row address signal from the buffer 23 and the refresh address signal from a refresh address counter 27 and transmits the selected address signal to a row decoder 28. The counter 27 counts the refresh address in response to the refresh request signal $\phi_{RFSH}$ and a first timing signal from the timing generator 25. The row decoder 28 selects the word lines in sequence in response to the selected address signal from the address selector 26.

Reference 29 denotes a read/write control circuit, which controls the read operation or write operation in response to an external low active write enable signal $\overline{WE}$ and a second timing signal from the timing generator 25. When the write enable signal $\overline{WE}$ is high level, a data-in buffer 33 becomes active. Inversely, when the signal $\overline{WE}$ is low level, an output control circuit 32 becomes active. Reference 30 denotes a sense amplifier, which amplifies the data signal on the bit line in response to the second timing signal from the generator 25 during the read operation. The column decoder 31 selects the bit lines in sequence in response to the column address signal from the buffer 24.

When the signal $\overline{WE}$ is low level and an external low active output enable signal $\overline{OE}$ is high level, the output control circuit 32 outputs the data read from the memory cells to the outside of the chip in response to the second timing signal from the generator 25. On the other hand, when the signal $\overline{WE}$ is high level, the data-in buffer 33 sends the data $D_{IN}$ input from outside of the chip to the memory cells in response to the second timing signal from the generator 25.

In the circuit constitution shown in FIG. 3, elements indicated by reference numerals 22, 25, 26, 27 and 28 correspond to the peripheral circuit 18 shown in FIG. 1.

Next, the operation of the circuit shown in FIG. 1 will be described with reference to the waveform diagrams shown in FIGS. 4a to 4e.

Initially, assume that a charge leakage occurs in one of the capacitors of the pseudo memory cells PMC$_1$, PMC$_2$, ---, e.g., capacitor C$_1$ of the cell PMC$_1$. In this state, when the potential V$_{CX}$ of the capacitor C$_1$ falls below the aforementioned predetermined level (V$_{CX}$<V$_{CC}$−V$_{THN}$−V$_{THP}$), the corresponding transistor Q$_1$ is turned ON, so that the signal $\phi_s$ on the line L$_2$ is raised from low level to high level. At this time, the signal $\phi_k$ is still high level, and therefore, the refresh request signal $\phi_{RFSH}$ becomes high level for a short time.

When the refresh request signal $\phi_{RFSH}$ is high level, each transistor of the pseudo memory cells PMC$_1$, PMC$_2$, PMC$_3$, ---, is turned ON, and thus each capacitor C$_1$, C$_2$, C$_3$, ---, is charged to the V$_{CC}$ level. Accordingly, each capacitor voltage V$_{CX}$ is raised to the V$_{CC}$ level, and thus all of the capacitors, including the leaking capacitor, are "refreshed".

After the signal $\phi_s$ becomes high level, the signal $\phi_k$ becomes low level, and thus the refresh request signal $\phi_{RFSH}$ becomes low level. The signal $\phi_{RFSH}$ is formed, via two inverters I$_1$ and I$_2$, into the signal $\phi_p$ as shown in FIG. 4a.

On the other hand, when each capacitor of the pseudo memory cells is charged to the V$_{CC}$ level in response to the refresh request signal $\phi_{RFSH}$, each transistor Q$_1$, Q$_2$, Q$_3$, ---, is turned OFF. In this state, the line L$_2$ is brought to a floating state and the signal $\phi_s$ maintains the previous high level. However, when the transistor Q$_b$ is turned ON in response to the rise in the signal $\phi_p$, the signal $\phi_s$ becomes low level, and the signal $\phi_k$ then becomes high level.

When the capacitor voltage V$_{CX}$ in a pseudo memory cell falls below the predetermined level, the corresponding transistor Q$_1$, Q$_2$, Q$_3$, ---, is turned ON, resulting in a rise in the signal $\phi_s$, and thus the aforementioned operation is repeated.

The most important points to note in relation to the self-refresh device are:
the device includes a sensor which accurately detects large fluctuations in the refresh time interval of the cells in accordance with the temperature, voltage, manufacturing process and the like; and,
the refresh interval of the pseudo memory cells is shorter than the refresh time limit value of the true memory cells under all conditions. As is known, the refresh time of the cells is different for every cell and can vary greatly, and therefore, in the present embodiment, the refresh interval of the pseudo memory cells is selected to meet the above conditions.

Figure 5A:
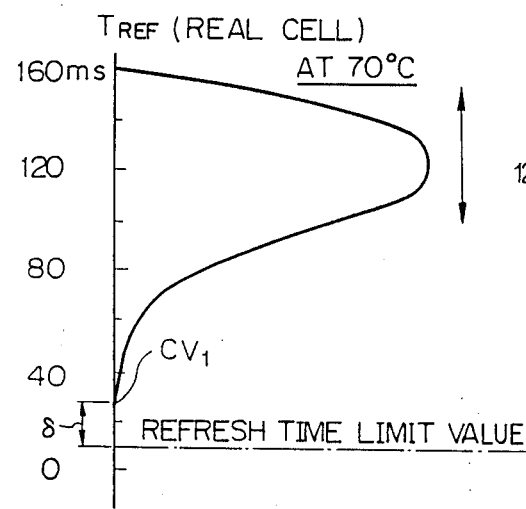
FIGS. 5a and 5b are graphs showing distribution characteristics in the refresh times of the real cells and pseudo cells, respectively.
Figure 5B:
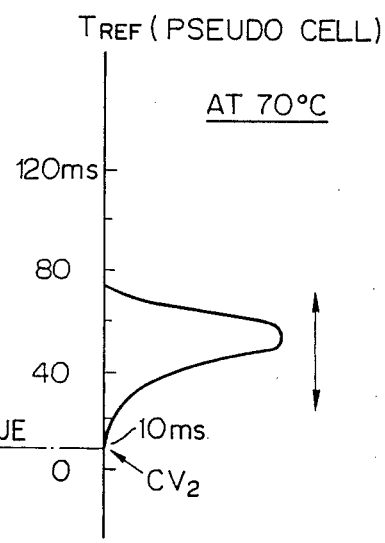

FIGS. 5a and 5b illustrate graphs of distribution characteristics in the refresh times of the real cells and pseudo cells, respectively.

Referring to FIG. 5a, when the temperature of the chip is 70° C., the shortest refresh interval is 30 ms and the longest is 160 ms. The most frequent refresh interval is 120 ms. The distribution curve CV$_1$ shifts downwards when the temperature rises, and upwards when the temperature falls. In the present embodiment, the pseudo memory cells in the sense cell array 14 are selected so as to represent the distribution shown in FIG. 5a, and the shortest refresh interval in the pseudo memory cells is selected to have shorter interval by a predetermined margin $\delta$ than the shortest refresh interval in the memory cell array 12.

Where the capacity of the pseudo memory cells is made smaller than that of the true memory cells, the junction area of the pseudo memory cells is made about the same as that of the true memory cells, and such pseudo memory cells are suitably distributed and arranged in the cell array 12. The distribution in the refresh times of the pseudo cells is as shown in FIG. 5b. Referring to FIG. 5b, the distribution curve CV$_2$ is analogous to the curve CV$_1$ shown in FIG. 5a and shifts downwards as a whole. The low peak value indicates that the number of cells, i.e., the capacity, is small. As shown in FIG. 5b, the shortest refresh interval is shorter by the margin $\delta$ than the shortest interval shown in FIG. 5a.

Figure 6:
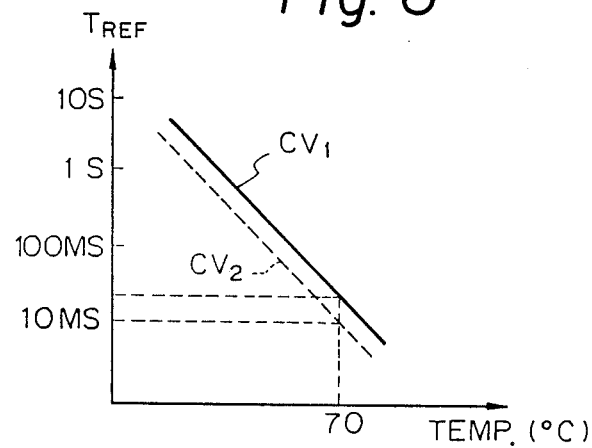
FIG. 6 is a graph showing a relation between the refresh time and the temperature.

FIG. 6 shows a relationship between the refresh time T$_{REF}$ and the temperature. The refresh time is changed in the form of an exponential function with respect to the temperature, as shown in FIG. 6. Therefore, if the refresh time of the true cells is indicated by the curve CV$_1$, the curve CV$_2$ having a shorter interval than that of the curve CV$_1$ is utilized to generate the refresh request signal $\phi_{RFSH}$. As a result, the destruction of the information of the memory is prevented, and at the same time, it becomes possible to lengthen the refresh interval as desired. Where the sense cell array 14 is used, a refresh corresponding to curve CV$_2$ becomes possible because the distribution curve CV$_2$ shown in FIG. 5b shifts upwards or downwards in accordance with the temperature.

In the illustrated preferred embodiment, the memory device includes a plurality of pseudo memory cells distributed and arranged on the chip, each pseudo cell having the same constitution as a real cell. The refresh request signal is generated by selecting the pseudo memory cells to represent the distribution of each refresh interval in the real memory cells and to have shorter interval than each refresh interval. As a result, it is possible to realize a memory device carrying out a self-refresh with a long interval, while automatically adapting the refresh operation to the existing voltage, temperature, process and the like.

Also, the cumbersome work needed to obtain the desired capacitance by cutting the fuses with the laser beam becomes unnecessary. In the present embodiment, the same purpose is accomplished only by making the capacity of the pseudo cells smaller than that of the true cells, or suitably selecting the threshold level of the transistors $Q_1$, $Q_2$, —, for detecting the capacitor voltages.

Although, in the illustrated preferred embodiment, the refresh request signal $\phi_{RFSH}$ is processed inside the chip, to carry out the refresh of the cell array 12, the present invention is not limited to this arrangement. For example, the refresh request signal may be once output outside the chip and then, via an external CPU, input inside the chip together with a refresh address signal.

The preferred embodiments described above are illustrative and not restrictive, the scope of the invention being indicated by the appended claims and all variations which come within the meaning of the claims are intended to be embraced therein.

I claim:

1. A semiconductor memory device for carrying out a self-refresh operation in response to a refresh request signal, said device comprising:
   a memory cell array formed on a chip and including a plurality of memory cells, each of said memory cells being provided in a matrix form along a plurality of word lines and a plurality of bit lines and each of said memory cells having a capacitor for retaining information to be refreshed by said self-refresh operation;
   a pseudo memory cell array provided in a vicinity of and along said memory cell array and including a plurality of pseudo memory cells, each of said plurality of pseudo memory cells having the same constitution as that of each of said memory cells in said memory cell array and including a capacitor having a charged potential;
   a first circuit means operatively connected to said pseudo memory cell array and including a plurality of first circuits, the number of which corresponds to a number of said plurality of pseudo memory cells, each of said plurality of first circuits monitoring a charged potential of a corresponding pseudo memory cell and independently generating a detection signal based on a lowering of the charged potential of the corresponding pseudo memory cell below a predetermined level; and
   a second level means operatively connected to said first circuit means for receiving at least one detection signal and for generating said refresh request signal in response to said at least one detection signal from said plurality of first circuits and for charging each capacitor in said plurality of pseudo memory cells, and wherein said second circuit means generates said refresh request signal at a timing which reflects a distribution of each refresh interval of said plurality of memory cells in said memory cell array.

2. A device as set forth in claim 1, wherein each first refresh interval in said plurality of pseudo memory cells is selected to reflect the distribution of each of second refresh intervals in said plurality of memory cells in said memory cell array and selected to be shorter refresh interval than each of the second refresh intervals.

3. A device as set forth in claim 2, wherein the shortest refresh interval among said first refresh intervals is shorter by a predetermined margin than the shortest refresh interval among said second refresh intervals.

4. A device as set forth in claim 3, wherein the capacitance of each of said plurality of pseudo memory cells is smaller than the capacitance of each of said plurality of memory cells in said memory cell array.

5. A device as set forth in claim 1, wherein said pseudo memory cell array is arranged at least in one row along the direction of said word lines in the vicinity of the memory cell array.

6. A device as set forth in claim 5, said device having two pseudo memory cell arrays, wherein each of said two pseudo memory cell arrays is arranged at each of the sides of said memory cell array along said direction of said word lines.

7. A device as set forth in claim 1, wherein each of said plurality of pseudo memory cells includes a transistor supplied with power by a power supply line and responding to said refresh request signal to be turned on, and a capacitor connected in series with said transistor and charged to a predetermined level when said transistor is turned on, and said first circuit means includes a plurality of transistors of the number corresponding to the number of said plurality of pseudo memory cells, each of said plurality of transistors being supplied with a voltage of a predetermined level for responding to a charged potential of a corresponding capacitor in said pseudo memory cells and generating said detection signal when said charged potential falls below said predetermined level.

8. A device as set forth in claim 1, wherein said second circuit includes an inverter responding to said detection signal, and AND gate responding to said detection signal and an output signal of said inverter and generating said refresh request signal, a delay means for delaying a change of said refresh request signal by a predetermined time, and a transistor responding to an output signal of said delay means and being turned on to invert a level of said detection signal when said output signal of said delay means changes to a predetermined level.

9. A semiconductor memory device for carrying out a self-refresh operation in response to a refresh request signal, said device comprising:
   a memory cell array formed on a chip and including a plurality of memory cells, each of said memory cells being provided in a matrix form along a plurality of word lines and a plurality of bit lines and each of said memory cells having a capacitor for retaining information to be refreshed by said self-refresh operation;
   a pseudo memory cell array provided in a vicinity of and along said memory cell array and including a plurality of pseudo memory cells, each of said plurality of pseudo memory cells having the same constitution as that of each of said memory cells in said memory cell array and including a capacitor having a charged potential;
   a first circuit means operatively connected to said pseudo memory cell array and including a plurality of first circuits, the number of which corresponds to a number of said plurality of pseudo memory cells, each of said plurality of first circuits monitoring a charged potential of a corresponding pseudo memory cell and generating a detection signal when the charged potential of the corresponding pseudo memory cell falls below a predetermined level; and
   a second level means operatively connected to said first circuit means for generating said refresh request signal in response to at least one detection signal from said plurality of first circuits and for charging each capacitor in said plurality of pseudo memory cells, wherein each first refresh interval in said plurality of pseudo memory cells is selected to reflect the distribution of each of second refresh intervals in said plurality of memory cells in said memory cell array and selected to be shorter refresh interval than each of the second refresh intervals.

* * * * *